(12) United States Patent
Breitschwerdt et al.

(10) Patent No.: US 7,288,485 B2
(45) Date of Patent: Oct. 30, 2007

(54) DEVICE AND METHOD FOR ANISOTROPIC PLASMA ETCHING OF A SUBSTRATE, PARTICULARLY A SILICON ELEMENT

(75) Inventors: Klaus Breitschwerdt, Filderstadt (DE); Bernd Kutsch, Stuttgart (DE); Franz Laermer, Weil der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 108 days.

(21) Appl. No.: 10/691,108

(22) Filed: Oct. 22, 2003

(65) Prior Publication Data

US 2004/0134615 A1    Jul. 15, 2004

(30) Foreign Application Priority Data

Oct. 23, 2002  (DE)  ................................ 102 49 350

(51) Int. Cl.
*H01L 21/302* (2006.01)
(52) U.S. Cl. ...................... 438/711; 438/706; 438/728; 156/345.42
(58) Field of Classification Search ................ 438/706, 438/710, 712, 714, 711, 728; 156/345, 42, 156/43, 47, 4
See application file for complete search history.

(56) References Cited

U.S. PATENT DOCUMENTS

| 5,501,893 A | 3/1996 | Laermer et al. |
|---|---|---|
| 5,888,907 A | 3/1999 | Tomoyasu |
| 6,042,687 A | 3/2000 | Singh et al. |
| 6,217,704 B1 | 4/2001 | Kitagawa |
| 6,303,512 B1 | 10/2001 | Laermer et al. |
| 6,320,154 B1 * | 11/2001 | Akahori et al. ........ 219/121.41 |
| 2002/0108713 A1 * | 8/2002 | Hanawa et al. ........ 156/345.48 |

FOREIGN PATENT DOCUMENTS

| GB | 2 327 382 | 1/1999 |
|---|---|---|
| JP | 63-282275 | 11/1988 |
| JP | 2000-91320 | 3/2000 |

* cited by examiner

*Primary Examiner*—Lan Vinh
(74) *Attorney, Agent, or Firm*—Kenyon & Kenyon LLP

(57) ABSTRACT

A method and a device suitable for its execution are provided for the anisotropic plasma etching of a substrate, especially a silicon element. The device has a chamber and a plasma source for generating a high-frequency electromagnetic alternating field and a reaction region for generating a plasma having reactive species inside the chamber, the reactive species being created by the action of the alternating field upon an etching gas, and a passivating gas that is especially simultaneously introduced but spatially separated from it. Furthermore, an arrangement is provided, by the use of which, in the reaction region, at least a first zone that has etching gas applied to it, and at least a second zone that has passivating gas applied to it, are defined. In addition to this, the device has a mixing region downstream from the reaction region, using which, reactive species generated from the etching gas in the first zone and reactive species generated from the passivating gas in the second zone are intermixed with each other before acting upon the substrate.

2 Claims, 9 Drawing Sheets

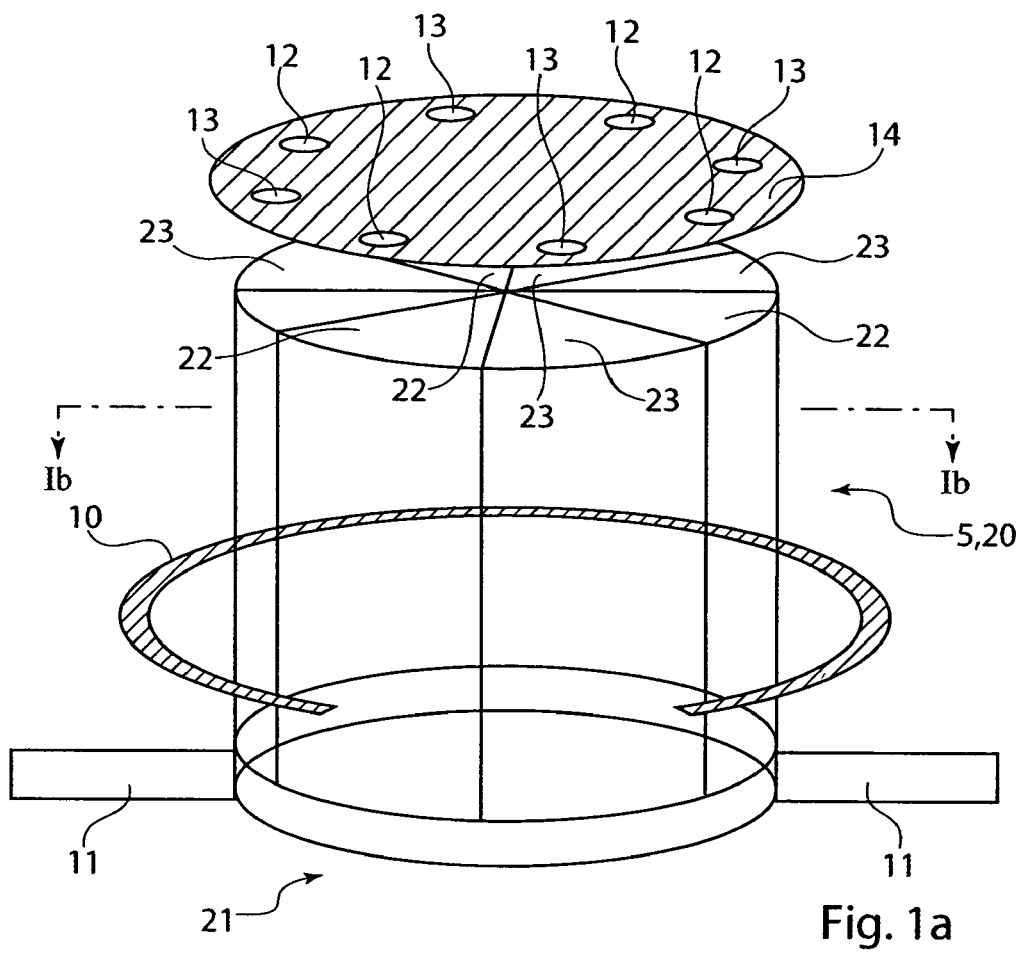
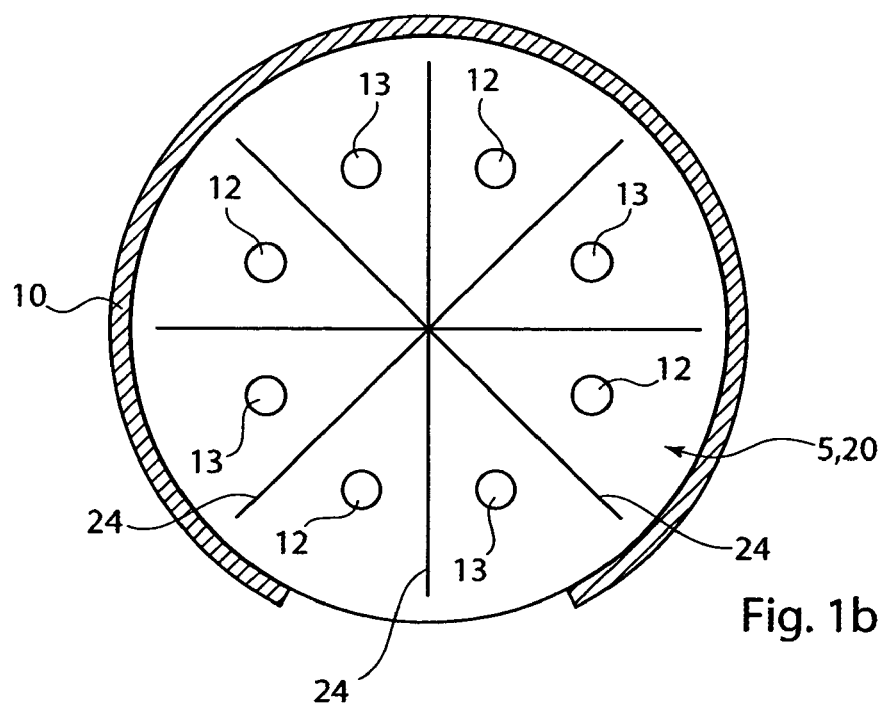

DEVICE AND METHOD FOR ANISOTROPIC PLASMA ETCHING OF A SUBSTRATE, PARTICULARLY A SILICON ELEMENT

FIELD OF THE INVENTION

The present invention relates to a device and a method for the anisotropic etching of a substrate, especially a silicon element, with the aid of a plasma source.

BACKGROUND INFORMATION

In the anisotropic high-rate plasma etching of silicon using a masking selectivity that is as great as possible, and profile control that is as good as possible, for example of the type in German patent reference no. 42 41 045, it is necessary to apply a stable passivation to the sidewalls of the structures to be etched, which may easily be removed again on the etching ground of the structures to be etched and while obtaining the masking selectivity, i.e. by an incidence of ions having a low energy input per unit of time. At the same time, it is necessary to make available a high density of etching species for the removal of the silicon on the etching ground.

Usually, fluorine radicals from fluorine supplying etching gases, such as $SF_6$, $NF_3$, $ClF_3$, $BrF_3$, etc, are used as etching species, which are broken up in a high-density plasma. As passivating species, there come into consideration, above all, teflon-forming monomers of passivating gases, such as $C_4F_8$, $C_3F_6$ or other fluorocarbons may have a low fluorine to carbon ratio, e.g. 2:1 or lower, which are also broken up in a high-density plasma.

The teflon-forming monomers build up a sidewall protective film, which prevents an etch attack on the sidewall, and leads to the desired anisotropy of the etching, while a directed ion incidence, above all on the etching ground, assures that the teflon-type protective films may be removed from there again, so that the etching ground essentially remains free from the protective film, whereas the fluorine radicals as etching species etch the exposed silicon surfaces on the etching ground.

If one makes the attempt to supply to a plasma fluorine-supplying etching gases and polymer-forming passivating gases at the same time, and to break these up in it, so as to generate simultaneously a high density of etching species, one observes a harmful mutual influence and undesired recombinations of the two species, i.e. instead of a buildup of polymer films on the sidewalls and efficient etching on the etching ground, the fluorine radicals and the polymerization-capable teflon former react to form saturated fluorine compounds which are largely inactive with respect to silicon.

In U.S. Pat. No. 5,498,312, in acceptance of this problem, it was suggested that one use an exceptionally high plasma density, in order to counter the undesired recombination reaction by using a correspondingly higher production rate of both species via a high density of both species which are incompatible per se. However, this attempt, in relationship to the achievable Si etching rate per kWatt of plasma efficiency, leads to relatively inefficient processes and is problematical with regard to profile control and the reactor contamination with polymers which appears in this context, which is caused, above all, by the required excess of passivating gas with respect to the etching gas.

An alternative attempt at a solution is referred to in U.S. Pat. No. 6,303,512, where etching gases and passivating gases are used which are more compatible with one another. Thus, in that document, $SF_6$ or $ClF_3$ is used as the fluorine-supplying etching gas, whereas the passivation is achieved by using oxygen and silicon tetrafluoride by depositing an $SiO_2$-type of protective film onto the sidewalls of the structures to be etched.

Fluorine radicals and oxygen radicals or $SiF_4$ do not react or recombine with one another, so that etching gases and passivating gases may be used without a problem as a stationary gas mixture. However, in this context it is disadvantageous that the sidewall passivating is effected by comparatively hard $SiO_2$-type films, which require an increased energy input by a directed ion incidence, so that they can be broken down on the etching ground, which greatly reduces the masking selectivity. Consequently, the etching process according to U.S. Pat. No. 6,303,512 must be operated at maximum load, giving consideration to the masking selectivity, which increases the risk of undesired etching ground roughness and so-called "grass formation". Passivating with the aid of $SiO_2$ also has the disadvantage that the inhomogeneities of the energy input onto the etched substrate bring about far greater interference effects than in the case of teflon-type films.

German patent reference no. 42 41 045 solves the problem of the "unfriendly coexistence" of Si-etching fluorine radicals and monomers forming teflon-type films by separating their generation in time, or rather carrying it out in alternating fashion. In this manner, teflon-type films formed during so-called "passivating cycles" are removed again during subsequent "etching cycles" which are isotropic per se, and redeposited deeper into the generated trenches, so that a local protective effect is created by entrainment of the sidewall film into the depth of the trenches. In this context, the restricted plasma stability during the gas exchange is a problem, where impedance changes in the plasma may lead to a faulty adaptation of the coupled-in high frequency radiation or microwave radiation, which results in a reflected output right up to the interruption of the plasma discharge ("blinking"). In addition, using this method, there are individual cases where completely smooth sidewalls of the trenches produced are not achievable, which may be a disadvantage for optical applications using mirror surfaces.

SUMMARY OF THE INVENTION

An object of the exemplary embodiment of the present invention, starting from German patent reference no. 42 41 045, to make available a method for the anisotropic high-rate etching of a semiconductor substrate such as silicon using a plasma, as well as a device suitable for carrying it out, using which the disadvantages referred to in German patent reference no. 42 41 045 as well as process instabilities or transients temporarily connected with them are overcome, and sidewalls of the trenches produced, that are as smooth as possible, can be achieved without grooving of the walls.

The device according to the exemplary embodiment of the present invention and the exemplary method according to the present invention has the advantage that one can do without a constant gas exchange between etching gas and passivating gas in the plasma etching device, so that process instabilities connected with that may be avoided, and overall even smoother sidewalls of the generated trenches may be achieved. At the same time, the advantages as in German patent reference no. 42 41 045 remain intact, and the process parameters and equipment configurations developed for this purpose may to a great extent continue to be used, apart from the newly provided arrangement for the definition of the etching gas zones and passivating gas zones. This being the case, the device according to the exemplary embodiment of the present invention is "easy" to integrate into existing equipment, and the exemplary method according to the present invention may continue to be conducted without any substantial investment expenditure or development of completely new process parameters based on the method according to German patent reference no. 42 41 045.

It is particularly advantageous that, using the exemplary method according to the present invention in a continuous process, very smooth etching profiles, particularly in silicon at very high etching rates, may be achieved. Therewith, particularly optically smooth sidewalls may be produced, of the kind required for optical components such as micromirrors. At the same time, an increased structuring accuracy at decreased "critical dimension loss" is achieved, which will become increasingly important for future microsensors.

Thus, it may be advantageous if etching gas, which flows through the etching gas zone used for producing fluorine radicals, has a certain proportion of oxygen added to it, as has been patented in German patent reference no. 198 26 382. This oxygen addition has no harmful effect on the process, but it assures that sulfur compounds react to SO2 and similar volatile materials, instead of separating out as a long chain polymer-type sulfur layer in the exhaust gas region of the plasma etching equipment.

It is also advantageous, especially when using ceramic materials for the tank of the plasma etching device, if one adds a smaller quantity of oxygen to the passivating gas which flows through the passivating gas zones that are used for the generation of teflon-forming monomers, in order, thereby, to suppress the creation of graphite particles which are able to act as harmful mircomasks on the semiconductor substrate which, as a rule, is designed as a silicon wafer. In order for the oxygen proportion in the passivating gas to remain harmless to the process, the oxygen quantities used there are limited, as a rule, to about 10% to 20% of the oxygen value which is added to the etching gas or can be added. When quartz glass or another glass is used as the material for the tank, this oxygen addition is mostly not required, since on glass surfaces no graphite particles form because of chemically bound oxygen.

Besides that, it is particularly advantageous if the plasma etching device is used in combination with a magnetic ion discriminator, as is referred to in German patent reference no. 199 33 841 and especially Application German patent reference no. 100 51 831 that builds up on it. On account of the technique explained there of the setting of opposing magnetic coil currents below the actual plasma generating zone or the plasma source, particularly uniform etching results are achieved over the entire substrate surface. Furthermore, in the case of the inductively coupled plasma which may be used within the scope of the exemplary embodiment of the present invention, when balances feeding of the inductive coil is used, as is referred to in EP 1 062 679 B1.

Finally, it may be advantageous if, while carrying out the plasma etching method explained, a continuous or stepwise change of the process parameters is undertaken, for example, of the process pressure, plasma output, the substrate bias output, the substrate bias voltage, the process gas flows or the substrate temperature. It is particularly advantageous if the ratio of passivating gas flow to etching gas flow is continuous or varied in discrete steps, as has already been proposed in U.S. Pat. No. 6,284,148 for a method like the type in German patent reference no. 42 41 045.

Incidentally, it may be advantageous that other further refinements of the process of the type in German patent reference no. 42 41 045, be they of the type of process technology or equipment technology, may be combined to the greatest possible extent with the etching device of the exemplary embodiment of the present invention and the explained etching method in question. Thus, especially also the double pulse technique referred to in German patent reference no. 199 33 842 for the substrate bias voltage or the substrate bias output, which above all is used for suppressing pocket formation in the region of a dielectric interface acting as an etching stop, may be integrated into the present method.

BRIEF DESCRIPTION OF THE DRAWINGS

FIG. 1a shows a diagrammatic sketch of a first specific embodiment of an applied element set onto the chamber of the plasma etching equipment.

FIG. 1b shows a section through FIG. 1a along the section plane drawn in.

FIG. 2a shows a second specific embodiment of the applied element alternative to FIG. 1a.

FIG. 2b shows a section through FIG. 2a along the section plane drawn in.

FIG. 3a shows still another specific embodiment of the applied element alternative to FIG. 1a or FIG. 2a.

FIG. 3b shows a section through FIG. 3a.

DETAILED DESCRIPTION

Figure 2A:
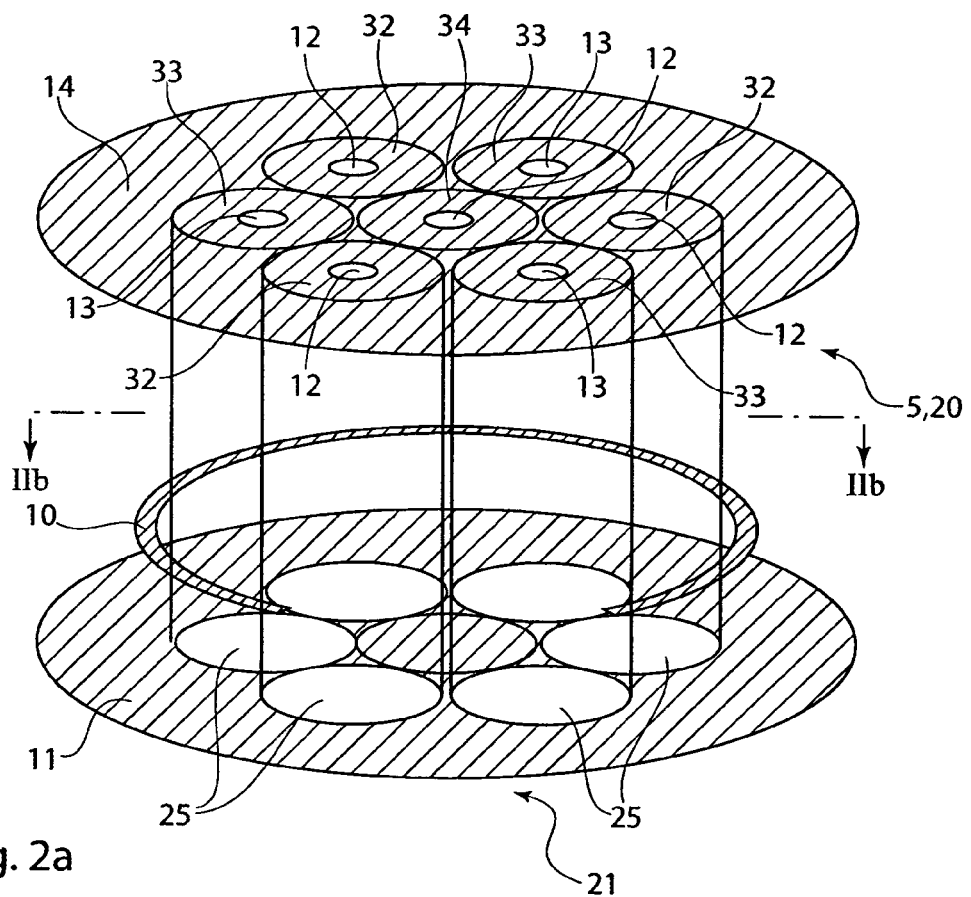

The device according to the exemplary embodiment of the present invention and the exemplary method according to the present invention that can be carried out with it, instead of a timewise separation of the generation of, for example, silicon etching species (F) and passivating species $C_nF_{2n}$) forming teflon-like films, aims first of all to undertake a spatial separation of the generation of both species in the plasma etching equipment in order to be able to generate these simultaneously and to the greatest extent possible without harmful interaction with each other. However, it should be emphasized that, besides the spatial separation, there may furthermore be naturally also a timewise separation, i.e. the exemplary embodiment and/or exemplary method according to the present invention may also be combined, if necessary, with the procedure according to German patent reference no. 42 41 045. However, this is not required as a rule.

As a concrete matter, at least one etching gas zone 23 is provided in plasma etching equipment 70 within the plasma source, i.e. in a reaction region 20, which essentially or predominantly has an etching gas such as $SF_6$ flowing through it that supplies fluorine radicals, i.e. in it there takes place at least to a great extent the plasma-induced generation of fluorine radicals.

Next to that, inside the plasma source in reaction region 20 at least one passivating gas zone 22 is provided, which has flowing through it essentially or predominantly a passivating gas, supplying teflon-forming monomers, such as $C_4F_8$ (octafluorocyclobutane), $C_3F_6$ (hexafluoropropene), $C_4F_6$ (hexafluoro-1,3-butadiene) or $C_5F_8$ (octafluoro-1,3-pentadiene or octafluorocyclopentene), i.e. herein there takes place at least to a great extent the plasma-induced generation of teflon-forming monomers.

Finally, between the plasma source and substrate 59 to be etched, which, as a rule, is a silicon wafer, plasma etching equipment 70 has a mixing region 21, which is situated as much as possible outside the plasma source or etching gas zone 23 and passivating gas zone 22. In this mixing region 21 there takes place as good as possible an intermixing of the two species on their way to substrate 59 that is to be etched, after first of all there was generated, at least largely independent of one another, as great as possible a density of etching species and passivating species in etching gas zone 23 and passivating gas zone 22.

This intermixing is necessary in order to achieve a homogeneous composition of the reaction gas at the location of substrate 59, which is a prerequisite for a homogeneous etching result over the entire substrate surface. On the other hand, during the intermixing, as was explained, an undesired recombination of both types of species appears having mutual destructive interference.

Surprisingly, however, it has turned out that this intermixing which takes place, according to the exemplary embodiment and/or exemplary method of the present invention, to a great extent only outside the plasma source or etching gaszone(s) 23 and passivating gas zone(s) 22, where the gas mixture already expands towards substrate electrode 60 and towards substrate 59 located on it, now has substantially less of an effect compared to the related art, with regard to the undesired recombination of the two species. In particular, what has been shown is that it is less the presence of great density of both species types that interferes with respect to the undesired recombination than, rather, the simultaneous presence of both initial materials at the same generating location, namely, in the region of the plasma source or in reaction region 20. In that location, the presence of the etching gas in a gas mixture changes the plasma conditions in such a way that no efficient generation of passivating species is possible any more, which in the related art makes necessary a substantial excess of passivating gas, so that the overall etching process loses etching speed to a considerable extent.

On the other hand, once a high density of fluorine radicals and monomers forming teflon-like films have been generated from the initial substances as independently from one another as possible, which is achieved by the spatial separation in separate zones, i.e. etching gas zone 23 and passivating gas zone 22, the coinciding of the two species types outside this zone 22, 23, and consequently in particular outside the plasma source, is then no longer so disruptive. This being the case, once a high density of passivating species and etching species have been formed independently of each other, and, in particular, the chain length, and with that the mass of the passivating species, i.e. the teflon-like precursor chains of a radical nature built up from teflon-forming radicals, is already relatively large, the recombination reaction is no longer such a decisive factor as if the two species sorts had already come together in the plasma during the generating process, and retroacted on the plasma conditions such as the electron density and the electron temperature. Furthermore, the situation is the more non-problematical, the greater the teflon-type precursor chains have become by the time they enter the mixing region, i.e. the more radical chains of the form $(CF_2)_n$ have been formed that are as long as possible and which may be branched.

FIG. 1a explains a first exemplary embodiment of the present invention schematically, in perspective view. For that, first of all, there is furnished or connected, according to FIG. 6 or FIG. 8, a chamber 53 of plasma etching equipment 70, in which the etching takes place, having an inductively coupled plasma source acting on reaction region 20, as is known, for example, from German patent reference no. 199 33 841. In addition, reaction region 20, at least here and there with the aid of an insert element 5 which is star-shaped in a top view and which, looked at spatially, which may have the surface of a cylinder as an envelope, is subdivided into several zones 22, 23 that are to a great extent separated from one another, at least for a gas.

Going into detail, in reaction region 20, on which the plasma source acts, several etching gas zones 23 and passivating zones 22 are provided, which have flowing through them an etching gas assigned to each etching gas zone 23 or a passivating gas assigned to each passivating gas zone 22. Etching gas zones 23 and passivating gas zones 22 which may alternate on insert element 5, in a top view. Supply of the gas allocated in each case to individual zones 22, 23 is carried out through corresponding gas inlets or gas entry openings 12, 13 in the form of bores in a cover plate 14 of insert element 5, so that via these, etching gas $SF_6$ may be supplied to etching gas zones 23 and simultaneously passivating gas $C_4F_8$ may be supplied to passivating gas zones 22, without intermixing of these gases taking place already in the region of the plasma generation or of the plasma source.

FIG. 1b shows the star-shaped structure of insert element 5 in a top view onto a section plane parallel to one of the base planes of insert element 5, a coil 10 being also indicated, which surrounds insert element 5, which is located in the plasma generating region of plasma etching equipment 70, and which generates the desired plasma in the interior of insert element 5 by inductive coupling.

Insert element 5 does not necessarily have an outer, such as a cylindrical, lateral surface, since this may also be formed by the wall of chamber 53 or by a tank mounted on chamber 53 or integrated with it in the region of insert element 5. Insert element 5 is dimensioned appropriately for this and adapted to the diameter of chamber 53 or the tank, and is installed there or welded on there.

However, besides star-shaped walls 24 starting from its center, which define etching gas zones 23 and passivating zones 22. Insert element 5 in addition may also have an outer wall 44 forming a jacket that is cylindrical or sleeve-shaped as a rule, so that insert element 5, viewed by itself, i.e. even before insertion into plasma equipment 70, also defines laterally enclosed etching gas zones 23 and passivating gas zones 22. It is true that this specific embodiment requires greater expenditure, but it makes insert element 5 more independent from the geometry of plasma etching equipment 70, and consequently also usable in a more versatile manner.

The overall gas stream of the etching gas or the etching gas mixture and the overall gas stream of the passivating gas or the passivating gas mixture in insert element 5 is controlled by the usual mass flow controllers, each respective gas stream may distribute itself to respectively "equivalent" (or comparable) zones 22, 23. Alternatively, each of zones 22, 23 may be assigned its own mass flow controller, which in each case individually controls the gas quantity supplied to these zones 22, 23.

In the explained example, the plasma excitation is performed by coil 10, which is run around the tank of plasma etching equipment 70. This coil 10 has one or more windings and may be fed in a balanced way as referred to in EP 1 062 679 B1.

There is no problem with the ignition of the plasma in the various zones 22, 23 induced by insert element 5, since coil 10 directly borders each of these zones 22, 23, and the electrical fields penetrating the volume afford a sufficient preionization for building up the desired inductive plasma mode.

If an insert element 5 made of quartz glass is used, the ultraviolet radiation that appears provides additionally that the plasma in all zones 22, 23 ignites uniformly as soon as even one zone 22, 23 has ignited and is emitting UV radiation, i.e. in this case, independently of an electrical intervention, a further ignition is achieved by UV preionization.

Insert element 5 may be formed of quartz glass and chamber 53 or the tank mounted on chamber 53 is formed of ceramic, it being the case, that insert element 5 is simply adjusted to chamber 53 or the tank, and adapted as well as possible to its geometry or is welded to it.

No great demands are made on the leakproofness or the impermeability to gas of individual zones 22, 23 among one another. In particular, it is sufficient if in each case at least the predominant part of the gas flowing through each zone 22, 23, whether etching gas or passivating gas, is of the appropriate kind, i.e etching gas or passivating gas. However, the structure may be such that no, or only a negligible intermixing of etching gas and passivating gas appears in the vicinity of insert element 5 or in reaction region 20. However, in this context, it should be emphasized that such intermixing, especially in the lower region of insert element 5 facing the substrate 59 to be etched, which is open there, cannot be completely avoided, and in that location is, rather, may be used.

The number of zones 22, 23 of insert element is even in the example explained, and amounts, for example, to six, which may be eight to twelve, in order for a homogeneous etching result to be achieved. Accordingly, insert element 5 is thus formed by a "six-pointed", "eight-pointed" or "ten-pointed" star, which is set into the actual tank or chamber 53 of plasma equipment 70.

Below the plasma source, which in the example explained may also be denoted as an inductively coupled multipole plasma source, the etching gas or passivating gas, broken up in respective zones 22, 23 by the plasma, exits and intermixes in mixing region 21 on its further way to substrate electrode 60 and substrate 59 positioned on it.

FIG. 2a shows as a second exemplary embodiment an especially advantageous form of the place to place subdivision of the internal space of plasma etching equipment 70 in reaction region 20, in etching gas zones 23 and passivating gas zones 22 for the spatially separated but which may be simultaneous generation of etching species and passivating species with the aid of inert element 5.

For this, a plurality of pipes 32, 33, 34 is provided, which in each case at their end faces are sealed from or welded to a cover plate 14 having corresponding bores as gas entry openings 12, 13 or a floor plate 11 having gas discharge openings 25. Each of these pipes 32, 33, 34 defines a generating zone for etching species or passivating species, i.e. borders an etching zone 23 or a passivating zone 22.

Around the thus-formed positioning of tubes 32, 33, 34, which may have an envelope that is at least approximately cylindrical, coil 10 is again laid, which in these tubes generates the plasma that is required for generating the etching species and the passivating species.

Figure 2B:
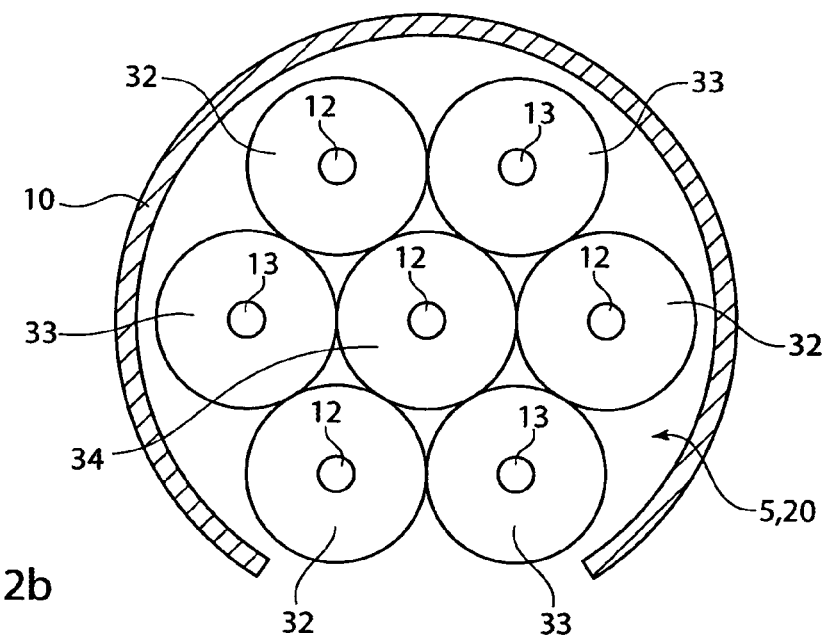

In the arrangement according to FIG. 2a, which is shown once again in section in FIG. 2b, seven tubes are used, the inner tube or central guiding tube 34 which may have passivating gas flowing through it, while the concentrically situated outer tubes or outer guiding tubes 32, 33 alternating circularly have etching gas and passivating gas flowing through them, i.e. each tube 33 having etching gas flowing through it is adjacent to a tube 32 having passivating gas flowing through it. It should, however, be emphasized that inner tube 34 is also able to have etching gas flowing through it.

The total number of tubes 32, 33, 34 which once again form an insert element 5, that can be removed, in the region of the plasma source, or that may alternatively be even firmly installed in plasma etching equipment 70, is uneven according to FIG. 2b, and, with respect to achieving an etching result that is as homogeneous as possible, amounts as a rule to at least seven, better nine, eleven or more.

According to FIG. 2a or FIG. 2b, coil 10 is placed around the outer envelope of tubes 32, 33, 34, in renewed fashion which may be a balanced coil feeding according to EP 1 062 679 B1 being used.

The produced species, i.e. fluorine radicals as etching species and $C_nF_{2n}$ radicals as passivating species, discharge in each case into process chamber 53 at the open, lower end of tubes 32, 33, 34, i.e. in the region of lower gas discharge openings 25, and are thus able first to intermix in mixing region 21, on the way to substrate 59 that is to be etched.

In response to the arrangement of guiding tubes 32, 33, 34 according to FIG. 2a, it is often necessary to install quartz glass as the material for these, since on the inside of central guiding tube 34, as a rule, incident UV radiation is required for igniting a plasma. This being the case, since now outer guiding tubes 32, 33 border directly on inductive coil 10, and mostly only in these outer tubes 32, 33 a sufficiently high electrical preionization can be effected by the coil that is sufficient for igniting an inductively coupled plasma, for the ignition of the plasma in central guiding tube 34, preionization by UV incident radiation from the surrounding outer tubes 32, 33 is the decisive mechanism. In particular, the electrical fields generated by coil 10 generally are not sufficient for a certain ignition of the plasma in central guiding tube 34. On the other hand, quartz glass has advantageous qualities in other respects too, so that it may be used anyway. Thus, quartz is a particularly "clean" material which effectively suppresses the creation of graphite particles and other micromasks during etching in etching equipment 70, and especially on substrate 59, and which has particularly smooth surfaces that are optimal for plasma containment.

Figure 3A:
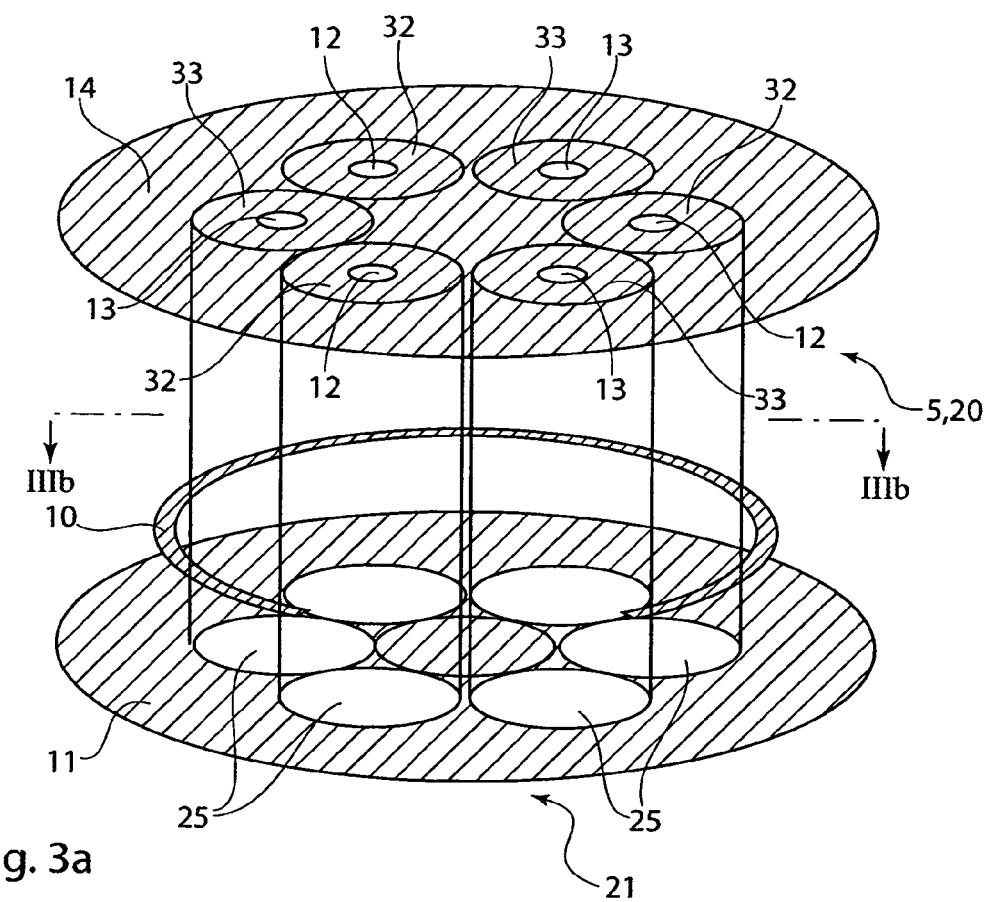
Figure 3B:
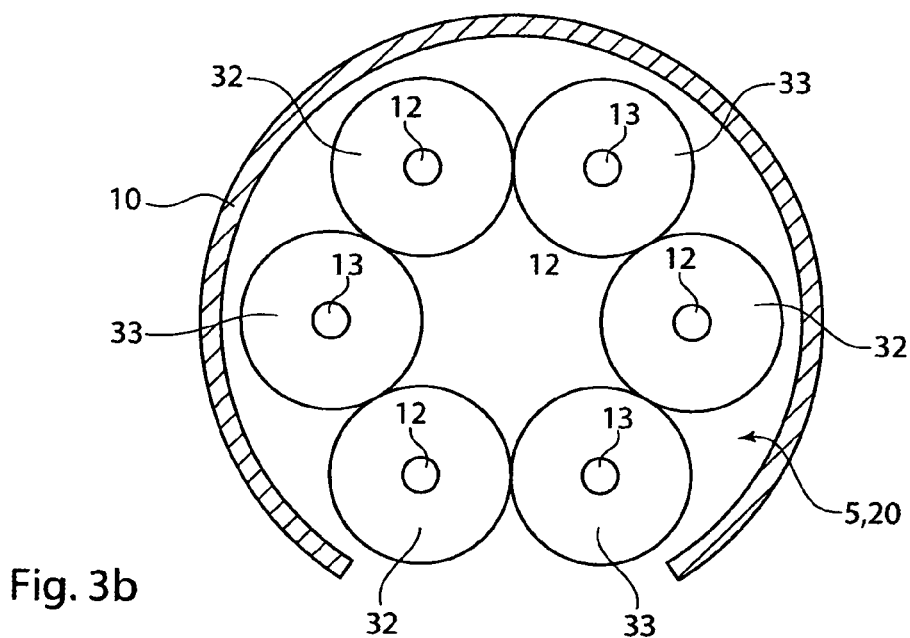

The arrangement of guiding tubes 32, 33 for etching and/or passivating gas according to a further exemplary embodiment as explained in FIGS. 3a and 3b may be provided for the use of ceramic tube materials, and does without central guiding tube 34. Other than that, it corresponds to the construction as in FIGS. 2a and 2b.

The sealing of tubes 32, 33 is done according to FIG. 3a, for example, on its end face using O-rings to cover plate 14 with gas inlet openings 12, 13 and/or to flow plate 11 with lower gas discharge openings 25. Alternatively, the end faces of tubes 32, 33 may also be welded to cover plate 14 and/or floor plate 11, provided these are made of quartz or permit a direct mechanical connection to tubes 32, 33.

Through lower gas discharge openings 25, in the area of floor plate 11, the reactive species produced in etching gas zones 23 and passivating gas zones 22 discharge and intermingle in mixing region 21 before acting upon substrate 59 that is to be etched. For this purpose, lower gas discharge openings 25 may have a diameter which corresponds to the inner diameter of each respective tube 32, 33, 34.

Analogously to the preceding exemplary embodiments, coil 10 is again placed about tubes 32, 33, according to FIGS. 3a and 3b, which may be positioned concentrically about the center of plasma equipment 70 and also of insert element 5, and the coil may be connected to a balanced coil feeding having an adaptive network of the type in EP 1 062 679 B1. Since at this location all tubes 32, 33 border directly on coil 10, plasma ignition on the inside of tubes 32, 33 by electrical/capacitative intervention takes place without a problem. Furthermore, the wall material of tubes 32, 33 may also be opaque in the UV range, which allows for the use of ceramic wall materials. The number of tubes 32, 33 may be even according to FIG. 3a, and should amount to at least eight.

Making tubes 32, 33 of ceramic has the advantage over quartz that no wall etching takes place, and that ceramic has, on principle, an unlimited service life, whereas quartz glass has to be replaced from time to time because of wear.

As an alternative to the precedingly used inductively coupled plasma source, a microwave source is also suitable, using which, in reaction region 20 in etching gas zones 23 and passivating gas zones 22 or tubes 32, 33, 34 assigned to them respectively, a plasma is able to be generated via a microwave radiation having a frequency such as 2.45 GHz that is coupled into these. For this, the Surfatron Principle that was referred to in German patent reference no. 42 41 045 may be used, i.e. a microwave radiation coupled into each of the tubes 32, 33, 34 via one or more microwaveguides spreads out in a border layer between their dielectric wall and the plasma generated over the whole length of the tubes, so that in such a way each tube 32, 33, 34 is filled by a highly dense microwave plasma. In this context, to each tube 32, 33, 34 its own microwaveguide, having a circulator, tuning elements and a magnetron may be allocated, but only such a microwaveguide may be provided which branches into tubes 32, 33, 34 at its end, particularly rotationally symmetrically via waveguide branching. In the specific embodiment according to FIG. 2a, in this case, for example, eight branchings from the main waveguide are provided, having postconnected partial waveguides, which branch off centrosymmetrically from them, and thus couple the desired microwave radiation into tubes 32, 33, 34.

Figure 4:
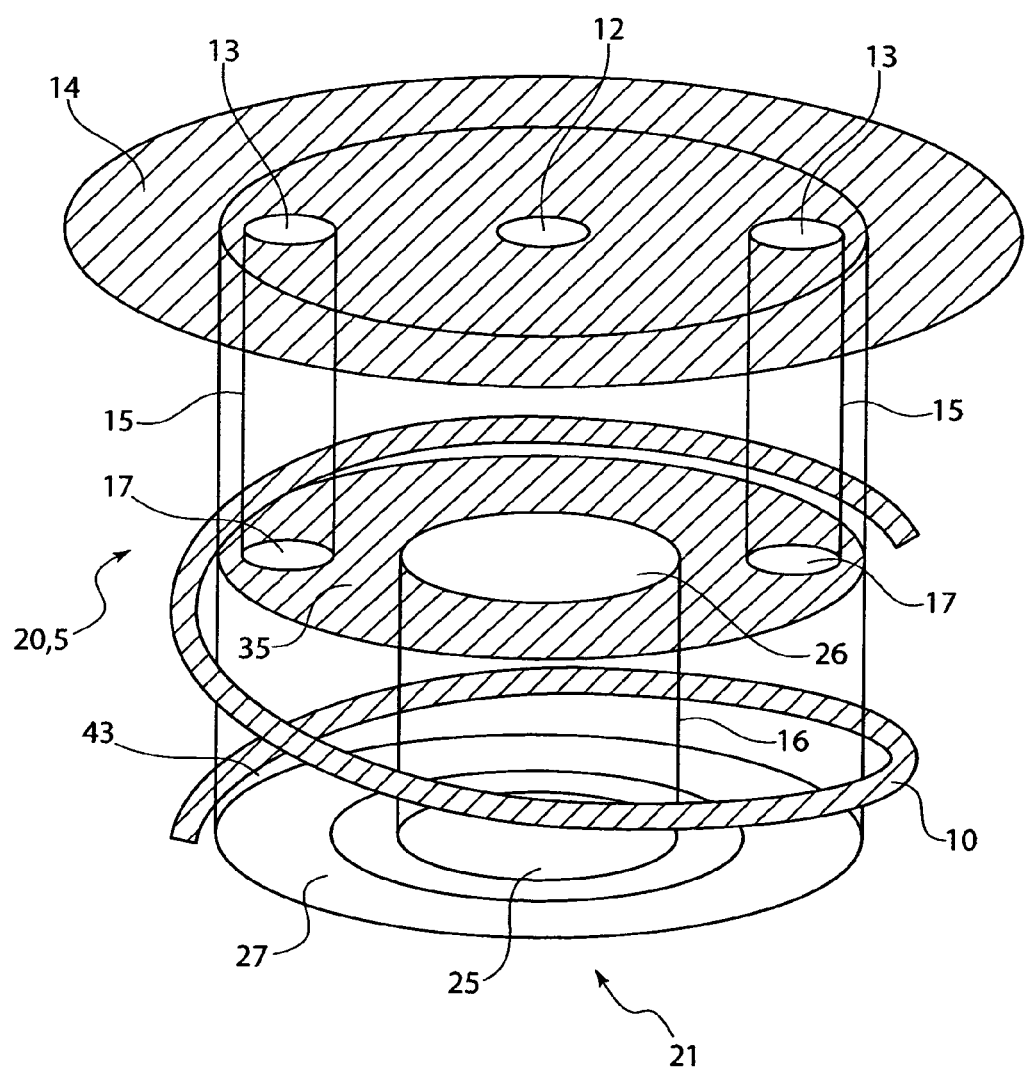
FIG. 4 shows a fourth specific embodiment of the applied element.

FIG. 4 shows a fourth exemplary embodiment of the present invention. In this context, a vertical separation of the plasma etching device is provided, into an upper zone 42, which may be a passivating gas zone, and a lower zone 43 underneath it, which may be an etching gas zone, which separation may be made via a horizontal partition wall 35 that is inserted into insert element 5 in the region of the plasma source at approximately half height. Upper zone 42 consequently corresponds to a passivating gas zone 22 according to FIG. 1a, 2a or 3a, while lower zone 43 corresponds to an etching gas zone according to FIG. 1a, FIG. 2a or FIG. 3a.

Moreover, through a centrical bore as upper gas discharge opening 26 in horizontal partition wall 35, using an adjoining discharge tube as lower gas guide 16, the gas broken up by plasma action in upper zone 42 may be conducted to process chamber 53, i.e. it only flows through lower zone 43 without coming into contact with the gas conducted there, and thus reaches mixing region 21.

The etching gas is conducted from above to lower zone 43, for example, via one or more, for instance, two or four feed-through holes or upper gas ducts 15 and appertaining lower gas inlet openings 17 in partition wall 35, these may be crossing upper zone 42 without the gas conducted in it coming into contact with the gas that is in upper zone 42, and the diameter of upper gas ducts 15 may be selected to be so narrow that no parasitic plasma is ignited therein while being conducted through upper zone 42. The etching gas broken up by the plasma acting upon it in lower zone 43, then further enters process chamber 53 through, for example, a discharge screen (or diaphragm or aperture) 27 positioned about a discharge tube used as lower gas duct 16, where it mixes first of all with the gas exiting from lower gas duct 16.

It should be emphasized, by the way, that the allocation of etching gas and passivating gas to upper zone 42 and lower zone 43, which correspond in their function to etching gas zone 23 and passivating gas zone 22 as in FIGS. 1a through 3b, may also be exchanged in the preceding exemplary embodiment, i.e. the passivating gas may be conducted to lower zone 43 and the etching gas to upper zone 42.

FIG. 4 also shows that coil 10 is laid about upper zone 42 and lower zone 43, and it now may have two or more windings. This ensures that both in lower and upper zone 42, 43 sufficient high frequency power is coupled in for the operation of an inductive plasma. The ignition of the plasma in upper and lower zone 42, 43 is not a problem, since both directly border coil 10, and by the electrical-capacitative intervention sufficient preionization is there for an inductively coupled plasma.

As the material for an insert element 5 according to FIG. 4, having an upper zone 42 and a lower zone 43 as well as gas ducts 15, 16 integrated into it, above all ceramic is suitable or quartz glass, quartz glass being easier to process.

The supply of etching gas and passivating gas to insert element 5 according to FIG. 4 takes place once more via cover plate 14, which has gas inlet openings 12, 13, that supply the respective gas of upper zone 42 or upper gas ducts 15 to lower zone 43. As seal once again, for example, O-rings are put in against the end faces. The lower connection of insert element 5 to the process chamber, according to FIG. 4, is made once again via such as a floor plate, not shown in FIG. 4, whose bores may correspond to the internal diameter of lower zone 43. Here too, as the seal, which may be an O-ring is installed against the end face of the tank wall.

Since the construction of the insert according to FIG. 4 is rather complex compared to those in FIG. 1a, 2a or 3a, the latter may be used over the former.

When carrying out or performing an anisotropic plasma etching of silicon, for instance for producing trenches that are as perpendicular and smooth as possible, using one of the precedingly explained devices, one may, to the greatest extent fall back upon the formulations already known from German patent reference no. 42 41 045. In particular, the inductively coupled-in electrical power at coil 10 lies between 400 Watts and 6 kWatts, and the power at the substrate electrode at the time average lies between 5 and 30 Watts, whereby generated ions are accelerated towards the substrate to be etched. Furthermore, both in the case of the coil power and the substrate electrode power, pulse techniques according to German patent reference no. 199 33 842 or magnetic fields in the range of a few mTesla according to German patent reference no. 199 33 841 or German patent application no. 100 51 831.1 may be used.

The process pressures in the plasma etching device lie between 10 μbar and 300 μbar, which may be between 30 Mbar and 150 gbar, especially 45 μbar to 90 μbar. In this context, depending on the setting of the gas flows in individual etching gas zones 23, 43 or passivating gas zones 22, 42, different pressures may come about, i.e the statement of pressure refers to mixing region 21 in the plasma etching device, and not to the pressures in tubes 15, 16, 32, 33, 34 or zones 22, 23, 42, 43 of etching gas or passivating gas.

The gas flows used amount to, for instance, 100 sccm to 2000 sccm (cm³/min at a standard pressure of 1 bar) $SF_6$ for the etching gas, especially 500 sccm $SF_6$, a proportion of 10% to 20% oxygen, 10 sccm to 1000 sccm $C_4F_8$ may be added for the passivating gas, especially 30 sccm to 250 sccm $C_4F_8$, to which a proportion of up to 2% oxygen may be added. If the gas flows for etching gas and passivating gas are set greatly different from each other, pressures may be generated that are clearly different from each other in etching gas zones 23, 43 compared to passivating gas zones 22, 42, i.e. there is now a possibility, thereby, to set the optimal pressure for each species (etching species, passivating species) in allocated zones 22, 23, 42, 43 for their generation subject to the given power parameters.

By the way, the substrate temperature may be −30° C. to +100° C., for example, +50° C. It should in each case be limited to values under 100° C. in order to maintain the stability of photoresist masks.

In the previously explained method executions it is generally advantageous if a quantity that is as great as possible of free fluorine radicals is made available, since these drive the etching of silicon. In line with that, one strives for a gas flow that is as great as possible of fluorine-delivering etching gases, such as 300 sccm to 1000 sccm $SF_6$, $ClF_3$, $F_2$ or others, so that, together with as high as possible a coupled-in plasma power of, for example, 3 kwatts through 5.5 kwatts, one obtains a large quantity of fluorine radicals. However, besides that, a certain quantity of polymer-forming species is needed for sidewall passivating: Apart from that, however, passivating gas is rather more undesired, since in every case it dilutes etching species that are present, but beyond that, it is also able to neutralize them by capture reactions. In this context, it should be considered that not only polymer-forming monomers, i.e species activated in the plasma, can act as recombination partner, but also and above all unexcited passivating gas molecules, which in the related art mostly represent the essential part of the passivating gas supplied, typically 80% to 95%. In the related art, these passivating gas molecules are not plasma-activated, but pass through the plasma generating zone unactivated. This being the case, a gas flow is worth aiming for that is as low as possible, but is just sufficient for the passivation or rather for ensuring a sufficient number of polymer-forming monomers, for minimizing recombination losses.

This can be achieved in that, on the one hand, compared to $C_4F_8$, more strongly polymerizing passivating gases such as $C_4F_6$ or $C_5F_8$ are used, and/or on the other hand, an at least approximately fixed proportion of the power brought into the plasma by the plasma source is supplied to the passivating gas supplied to plasma etching equipment 70 and especially to the plasma source, independent of the respective passivating gas flow.

This decoupling of the plasma power supplied to the passivating gas from the passivating gas flow in the region of the plasma source makes it possible, even in the case of a lesser passivating gas flow, to expose the passivating gas to an extremely intensive plasma excitation, and thus to achieve a clearly higher crack rate, i.e. to attain a clearly higher proportion of passivating gas molecules which are actually activated in the plasma. In this way, at a passivating gas flow of, for instance, only 40 sccm $C_4F_8$ a similar quantity of polymer formers can be generated, which in response to a process according to U.S. Pat. No. 5,498,312, would be possible only at a gas flow of 200 sccm or greater.

This power input into the passivating gas that is a function of the passivating gas flow, and the very efficient formation of passivating gas molecules activated in the plasma is achieved in the "multipole arrangement" that was explained in the preceding section in that the plasma power made available for one gas type is determined primarily by the geometry of the individual excitation zones, i.e. of etching gas zones 23 and passivating gas zones 22, and is in simple approximation independent of the gas flow of the respective gas type. Consequently, in the case of, for example, a stationary gas composition during the process, the parameters "gas flow of one type" and "the plasma power allotted to the respective gas type" are decoupled from each other, which considerably broadens the scope for optimization, and, at considerably reduced passivating gas flows, permits, as described, carrying out processes having a stationary gas composition and minimal recombination losses.

In this connection, the magnetic coil device referred to in German patent reference no. 100 51 831, below the plasma source or reaction region 20 in the form of a "multipole plasma generating zone", may be used, since, besides a homogenization of ion flows and radical flows towards substrate 59 that is to be processed, it effects, specifically by having a stationary gas composition, a further increased efficiency of the plasma source. Such a magnetic plasma support advances to a great degree the activation of passivating gas species, even at low passivating gas flows, so that overall a crack rate of 50% to 90% can be achieved.

Figure 5A:
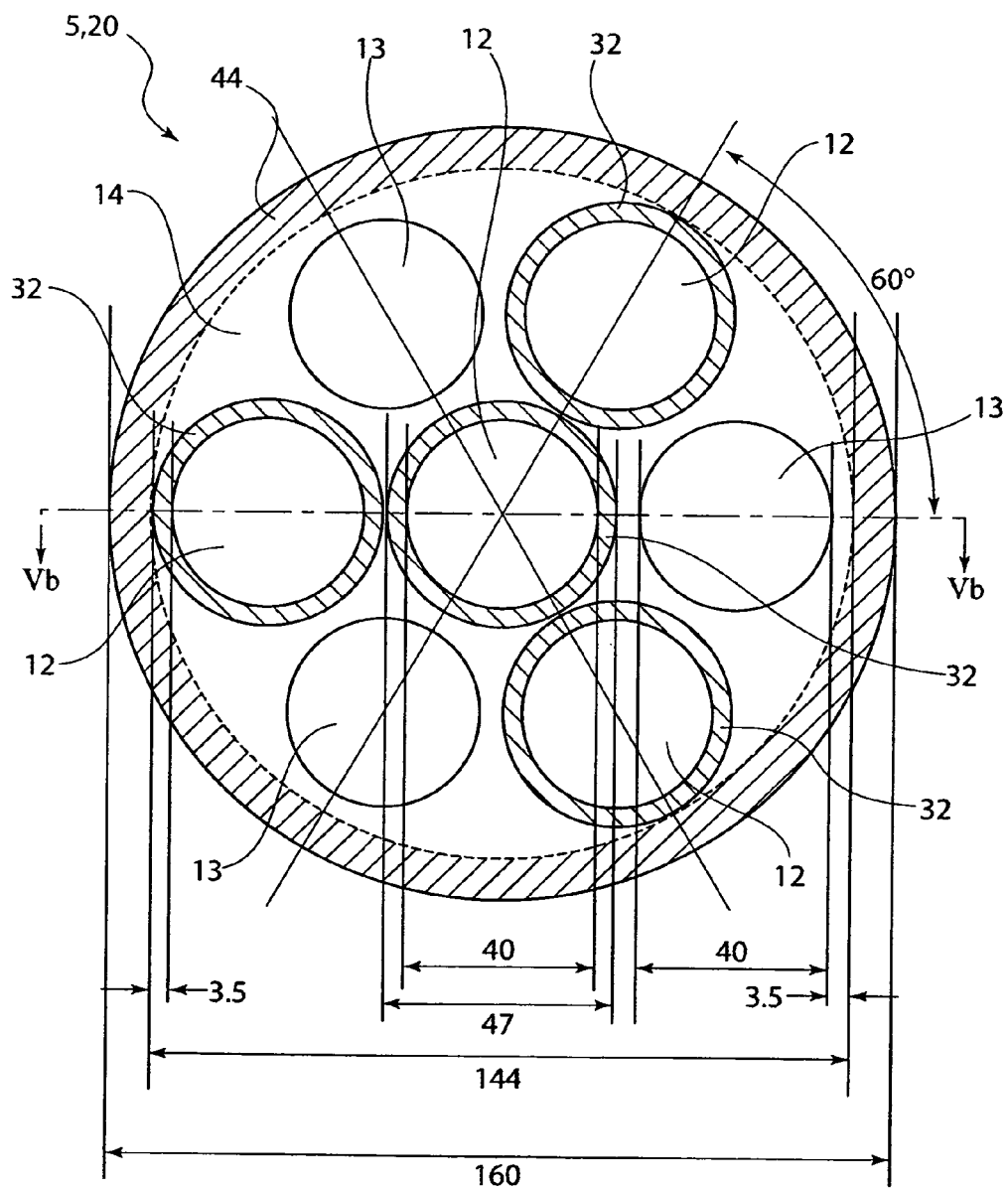
FIG. 5a shows a top view onto a further specific embodiment of the applied element.
Figure 5B:
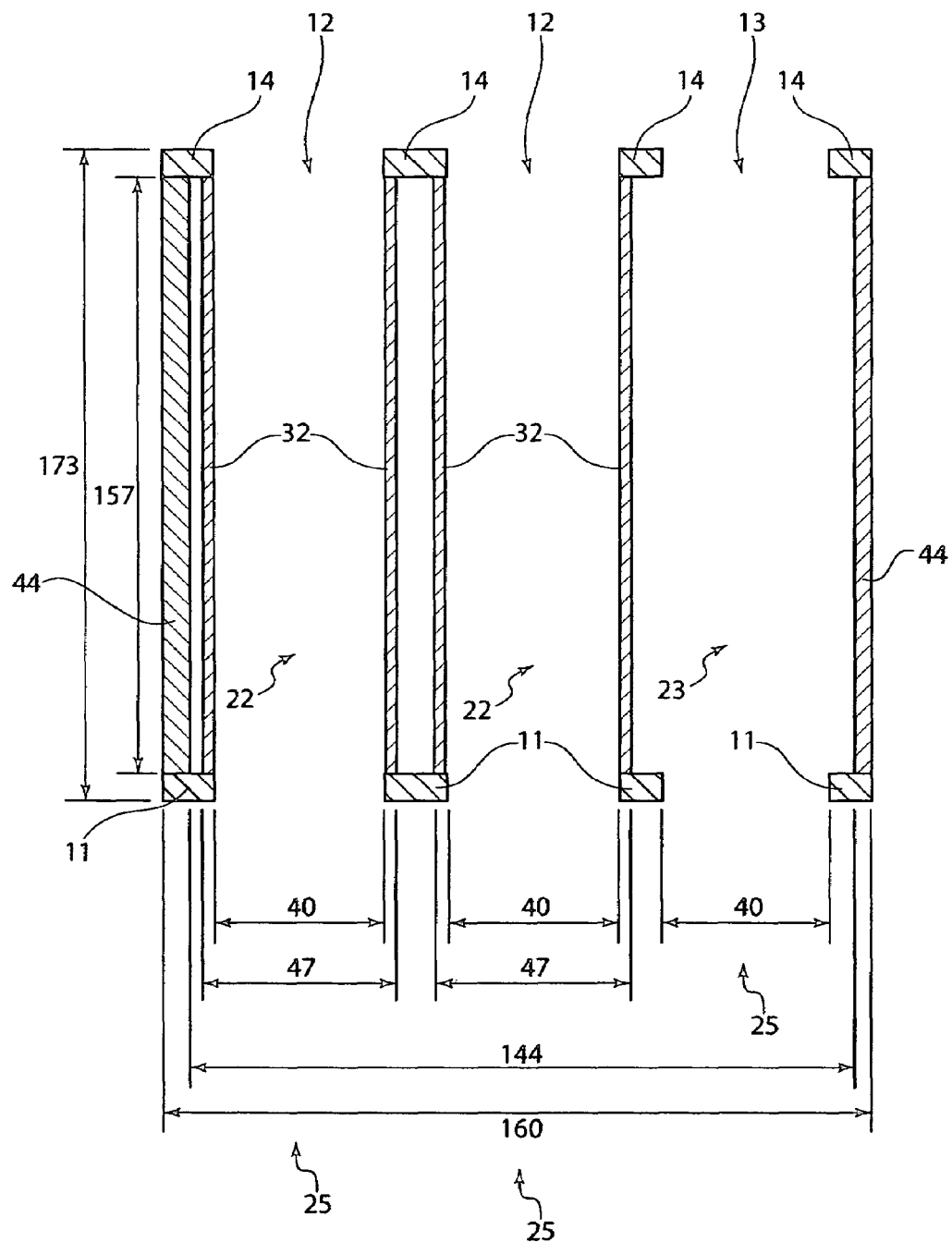
FIG. 5b shows a section through FIG. 5a along the section plane drawn in there.

Against this background, FIG. 5a and FIG. 5b show a further insert element 5, that is an alternative to those in FIGS. 1a through 4. FIGS. 5a and 5b, for example, have been furnished with dimensionings in millimeters and have been drawn largely to scale.

In detail, FIG. 5a shows a top view onto a tank or insert element 5 made of ceramic or, which may be of quartz glass, which may have a cylindrical outer wall 44 into which four tubes are inserted as passivating gas guiding tubes 32. Inside the tank a plasma is maintained, which may be by inductive excitation and especially which may have magnetic support of the kind referred to in German patent reference no. 100 51 931, the etching gas, which may be $SF_6$, being supplied to the volume of the interior of the tank not taken up by passivating gas guiding tubes 32. The passivating gas, which may be $C_4F_8$, $C_3F_6$, $C_4F_6$ or $C_5F_8$, is conducted to passivating gas guiding tubes 32, and in these there is also induced a plasma discharge.

As is seen from the dimensions of the tank and the four tubes 32 given in millimeters in FIG. 5a, independently of the gas flows, ca ⅓ of the coupled-in total power is allocated to tubes 32 which have gas flows going through them, while ⅔ of the coupled-in total power is allocated to the region outside tubes 32. Thus, for example, at a plasma power of 3600 Watts, 1200 Watts are allocated to the passivating component (independent of the passivating gas flow) and ca 2400 Watts are allocated to the etching component (independent of the etching gas flow). FIG. 5a shows in section how tubes 32 are installed in tank 5. One can also recognize gas input opening 12 provided in the region of cover plate 14 for the passivating gas and gas input opening 23 for the etching gas. Thus, in the interior space of tubes 32 that have passivating gas flowing through them, passivating gas zones 22 form during operation, and in the remaining volume of tank 5 an etching gas zone 23 forms. In the lower part of the tank, gas discharge openings 25 are provided.

Of course, other arrangements than the ones given as examples are also suitable for insert element 5. Thus, instead of a tank, a number of tubes 32, 33 situated side by side can also be provided as plasma generating chambers, the number of etching gas guiding tubes 33 and of passivating guiding tubes 32 regulating the subdivision of the plasma power supplied to the respective process component, independent of the actual gas flows. The only thing that is important is that a volume predefined for the equipment in region 20 is assigned to the passivating gas and the etching gas. This being the case, starting from FIG. 4, it is possible without a problem, in the case of a vertical subdivision of insert element 5 into two plasma-generating zones 42, 43, to feed these with different powers, and thus to undertake the desired subdivision, independently of the actual gas flows, and establish it by the selection of the generating power respectively allocated to zones 42, 43.

The set-up according to FIGS. 5a and 5b is especially advantageous, since it remains close to the standard of usual etching equipment, and it requires only one high-frequency generator 54 for coil 10 and only one coil 10 for the plasma generation. Incidentally, insert element 5 has a comparatively small inside diameter of 100 mm to 150 mm, 144 mm, for instance, which leads to an especially high power density in the interior, makes the plasma particularly stable, and increases the efficiency of the molecular excitation especially with regard to the passivating gas.

Figure 6:
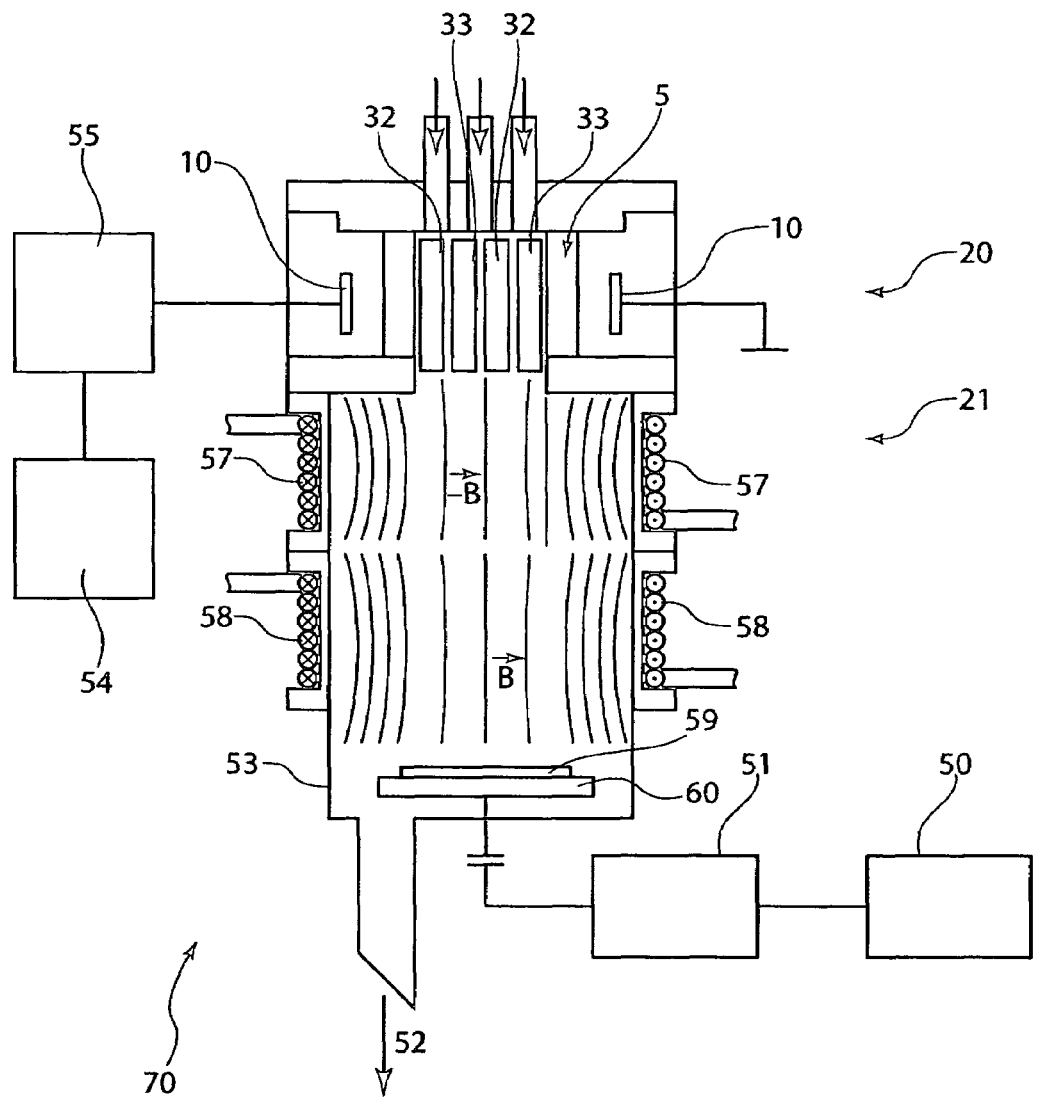
FIG. 6 is a diagrammatic sketch of a plasma etching equipment.

FIG. 6 shows a diagrammatic sketch of a plasma equipment 70 known widely from German patent reference no. 100 51 831, having a substrate bias generator 50, a first adapter network 51 ("matchbox") allocated to the latter, a chamber 53, an exhaust gas line 52 which is connected to powerful vacuum pumps, a substrate electrode 60 on which, during operation, there is a substrate 59, such as a silicon wafer, a coil generator 54, a second adapter network ("matchbox") allocated to it, a coil 10 for generating an inductively coupled plasma, and insert element 5 according to one of the exemplary embodiments described. Insert element 5 or the tank continues to be located in reaction region 20, from which mixing region 21 is downstream, on the inside of chamber 53. Finally, in FIG. 6, an upper coil 57, regionally surrounding chamber 53, and a corresponding lower coil 58 are provided, which each generate a magnetic field on the inside of chamber 53, and are oppositely directed to each other. The following is an exemplary process formulation for this plasma etching equipment 70 as carried out for putting trenches in silicon:

etching gas and etching gas flow: 500 sccm $SF_6$
passivating gas and passivating gas flow: 30 sccm $C_4F_8$ or $C_3F_6$
process pressure inside chamber 53 in the substrate region:
70 μbar
plasma source power (at a high frequency of 13.56 MHz): 2700 Watts to 5500 Watts
current of upper coil 57 (420 windings, 40 cm diameter): 7.5 Amp
current of lower coil 58 (360 windings, 40 cm diameter): 5.5 Amp Furthermore, a high frequency power (at, for example, 13.56 MHz carrier frequency) in double pulse operation according to German patent reference no. 199 57 169, having a peak power of 500 Watts, a pulse repetition rate of 100 kHz at 10% duty cycle and an additional slow pulsing having, for instance, 40 Hz at 50% duty cycle may be coupled into substrate electrode 60, which is an effective power at substrate electrode 60 of 20 to 25 Watts.

If one wishes to do without this double pulse technique and to apply an unpulsed high-frequency power (at, for example, 13.56 MHz carrier frequency) a modified process formulation results:

etching gas and etching gas flow: 500 sccm $SF_6$
passivating gas and passivating gas flow: 50 sccm $C_4F_8$ or $C_3F_6$
process pressure inside chamber 53 in the substrate region:
45 μbar
plasma source power (at a high frequency of 13.56 MHz): 2700 Watts to 5500 Watts
current of upper coil 57 (420 windings, 40 cm diameter): 7.5 Amp
current of lower coil 58 (360 windings, 40 cm diameter): 5.5 Amp In this case, a further effective bias power of 15 Watts is coupled into substrate electrode 60.

In the case of the first process formulation, a smaller passivating gas flow compared to the second process formulation is sufficient, since the double pulse technique applied clearly improves the efficiency of the sidewall passivation that is striven for. In particular, periodic phases without ion bombardment and the thereby induced improved passivating efficiency lead to a smaller number of passivating species being sufficient for the passivation, which, in turn, brings with it smaller recombination losses.

Other process formulations may be directly derived from this, particularly in the case of a changed subdivision of the volumes available to the passivating gas and the etching gas in the region of the plasma source or reaction region 20.

Figure 7:
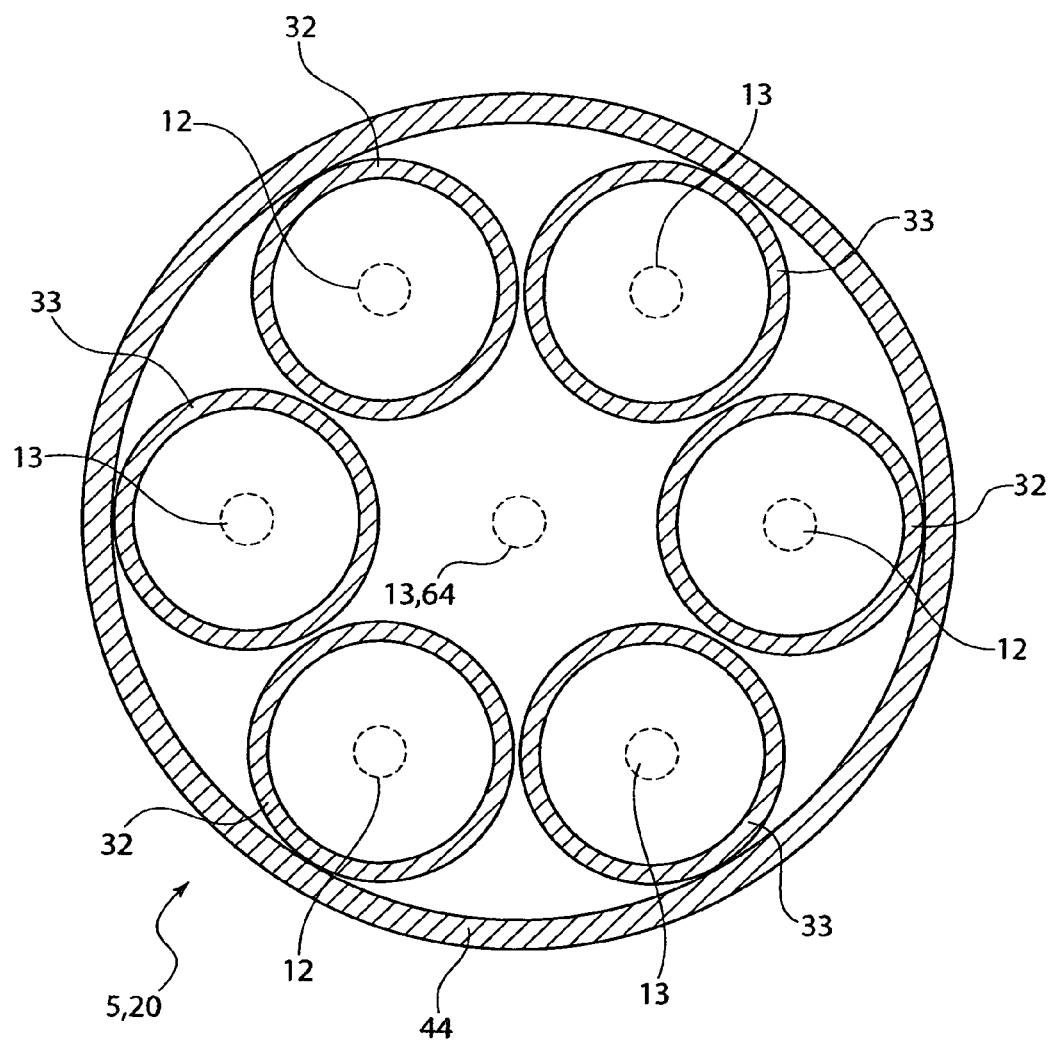
FIG. 7 is a specific embodiment alternative to FIG. 5.

FIG. 7 explains a further exemplary embodiment for an insert element 5, which is designed to be a cylinder-shaped tank made of quartz glass or ceramic, and has an outer diameter such as 160 mm and an inside diameter such as 130 mm. Furthermore, a set-up of, for example, six tubes 32, 33 each having an outer diameter of 42 mm and a wall thickness of 3 mm is placed into this tank, so that six individual chambers result, of which, in the explained example, three have etching gas and three have passivating gas applied to them. Consequently, inside tubes 32, 33, three passivating gas zones 22 and three etching gas zones 23 form. Since quartz tubes are attacked by etching by the plasma chemistry, they have to be renewed regularly, and thus constitute "consumables". Of course, a different, especially a larger number of tubes 32, 33 can be used. In FIG. 7, an exchange of tubes 32, 33 is possible in a particularly simple and cost-effective manner, since these are simply inserted into the tank, and support one another towards the inside, and towards the outside they are supported by the inner wall of the tank or outer wall 44. In addition, not the entire tank or insert element 5 has to be exchanged, but only tubes 32, 33. There is also provided a floor plate (not shown) which has an edge that protrudes by a few millimeter, which supports the side of tubes 32, 33 facing substrate 59, and thus prevents tubes 32, 33 from falling into chamber 53. To each of tubes 32, 33 there is also allocated, in the vicinity of the cover plate, a gas input opening 12, 13 on the side facing away from substrate 59. The zone framed by tubes 32, 33 in the region of center 64 of insert element 5, may, if necessary also have etching gas or passivating gas flowing through it via an associated gas inlet 13, and can thus also become a passivating gas zone 22 or, which may be an etching gas zone 23. Moreover, here too an additional tube 34 analogous to that in FIG. 2 is provided, which, among other things, helps to support remaining tubes 32, 33.

Figure 8:
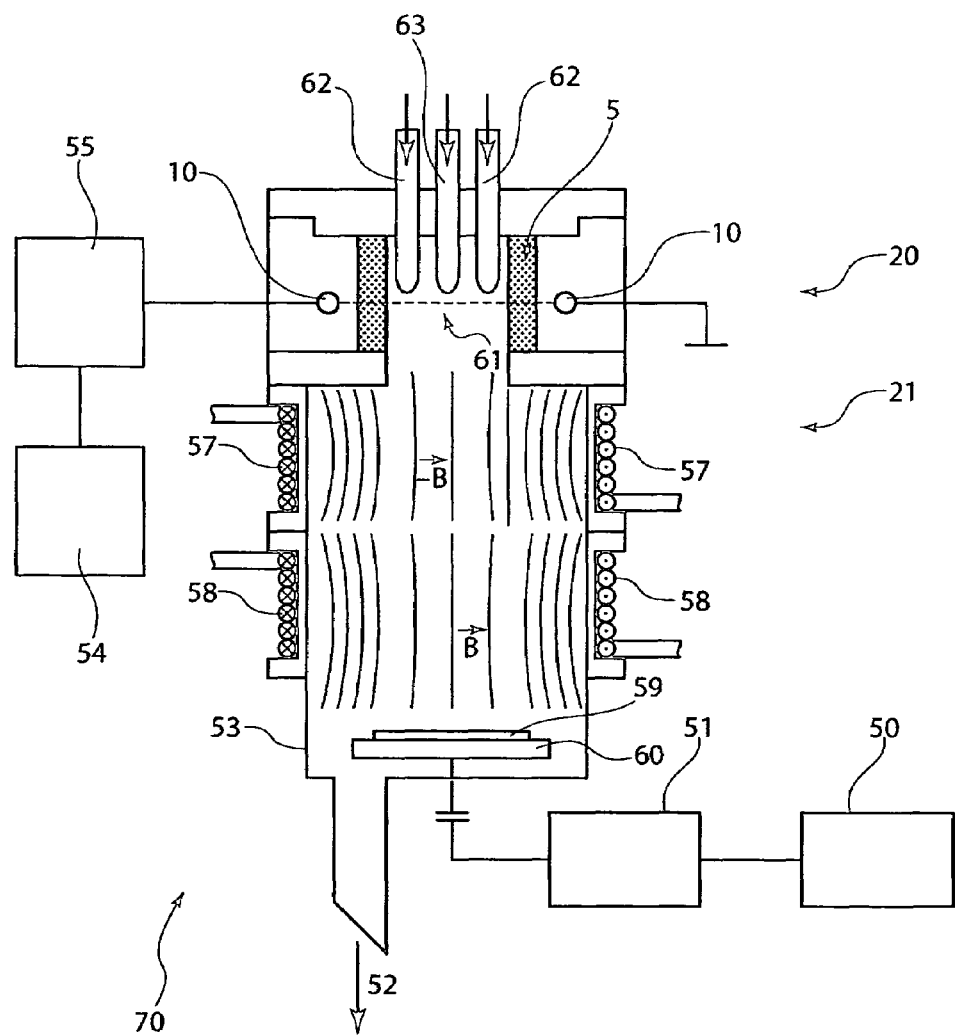
FIG. 8 is a specific embodiment of an etching equipment alternative to FIG. 6.

Finally, FIG. 8 explains another exemplary embodiment of a plasma equipment 70, in which passivating gas zones 22 and etching gas zones 23 in reaction region 20 of the plasma source are not defined by an insert element 5 but by the generation of gas streams as bundled as possible in reaction region 20. In this manner, one can even do without the use of tubes 32, 33. To be specific, differing from FIG. 6, in FIG. 8, for example, lance-shaped gas guidances are provided, which are subdivided into passivating gas lances 62 and etching gas lances 63. By the use of these, the etching gas and the passivating gas can be injected directly into the plasma source, they may end a little above a coil plane 61 defined by coil 10. In this way, the etching gas and the passivating gas are, one the one hand, introduced into a zone having very dense plasma which has a high excitation efficiency, and on the other hand, there is thereby largely suppressed a too early intermixing of the two gases, as early as in the plasma source, by diffusion, and a gas flow cone which unavoidably gradually opens up for each lance 62, 63. Consequently, each gas type may be excited locally by itself individually, and without recombination losses in the highly dense plasma, plasma conditions coming about which largely correspond optimally to the properties of the respective gas type, and are not impaired by the respectively other type. The directed gas flow induced by lances 62, 63 sufficiently defines a volume allotted to the respective gas type which comes about according to FIGS. 1 through 5 or 7 because of tubes 32, 33 or zones 42, 43 used there, before the gases, after flowing through the plasma source, intermix in downstream mixing region 21.

Lances 62, 63 may be arranged in the form of tubelets or capillaries, made, for example, of aluminum, anodized aluminum, ceramic glass, quartz glass or another material that is not attacked by the plasma chemistry. In an exemplary embodiment, altogether at least five, which may be at least seven lances 62, 63 are used, the spatial arrangement and the subdivision of the function in passivating gas lances 62 and etching gas lances 63 being able to correspond in a top view to the arrangement of tubes 32, 33 or zones 22, 23 according to FIG. 1b, FIG. 2b FIG. 3b, FIG. 5a or FIG. 7. In particular, adjoining lances 62, 63 may have different gas types (etching gas or passivating gas) flowing through them.

According to the exemplary embodiment of FIG. 8, an inductive coil 10 is provided, having a single even winding, which establishes coil plane 61, inductive coil 10 may be fed in a balanced way at high frequency according to EP 1 062 679 B1 and grounded at its center. The zone of highly dense plasma excitation thus extends ca 20 mm to 30 mm above and below coil plane 61. In an exemplary way, lances 62, 63 end 20 mm to 60 mm above coil plane 61, i.e. exactly at the edge or somewhat above the zone of highly dense plasma excitation.

If a coil 10 having several windings is used, it first has to be determined how far the zone of highly dense inductive plasma excitation extends upwards. From that one may establish how far gas lances 62, 63 should extend into chamber 53 in the region of the plasma source. In this context, lances 62, 63 should release the process gases into chamber 53 a little above the ascertained zone of highly dense plasma excitation, so that they intermix as little as possible on the way to, and in reaction region 20.

At a process pressure of 30 μm to 100 μm, the free path lengths of the gas molecules are at an order of magnitude of a few millimeters, up to about 10 mm. For a set-up of, for instance, seven gas lances 62, 63, the distance between these may amount to ca 50 mm, and for a larger number of homogeneously distributed gas lances 62, 63 correspondingly less. The lower limit of the distances between lances 62, 63 is ca 10 mm, i.e. more than the free path lengths of the gas molecules at the given pressure. Consequently, the two gas types mix only a little on their way to, or through reaction region 20, and spread out essentially on the discharge cones of lances 62, 63 all the way through the plasma source, where they can be individually excited under favorable plasma conditions and without recombination losses. The desired effect of the directed discharge of the gases from lances 62, 63 may be reinforced by providing relatively narrow discharge cross sections and consequently relatively high discharge speeds. Thus, lances 62, 63 may be designed in the form of tubes having an outer diameter of 3 mm to 4 mm and an inner diameter of 1 mm to 2 mm, or one may provide still smaller capillaries having cross sections clearly below 1 mm, in order to produce a gas flow that is directed as much as possible and has a high discharge speed. The more directed the discharge cone from gas lances 62, 63, the less is also the intermixing of the individual gas types on their way through the highly dense plasma zone or reaction region 20, thus, the better is also the flow-conditioned separation of the individual gas types from each other. The form of the discharge cones of lances 62, 63 can moreover be considerably influenced by the form of the discharge opening of lances 62, 63. Furthermore, undesired turbulences or stalls may also be suppressed thereby Alternatively to a set-up of individual tubes 32, 33 or lances 62, 63, the individual gas discharges may also be produced by a cover having a multiplicity of narrow discharge openings like a kind of gas shower, a so-called "shower head", which assumes the function of lances 62, 63 or of insert element 5, once again, which may adjoin discharge openings in each case having different gas types flowing from them.

Such a shower head may be made of aluminum, anodized aluminum, ceramic, glass, quartz glass or another material resistant to the plasma chemistry. Furthermore, in this case, the shower head has allocated to it a network of flow channels on, for example, two planes, which supplies to the discharge openings the respective gas type in a defined and separate manner. Finally, it is important also in this case that the shower head be placed at the right distance to the zone of high plasma excitation density, which may be 20 mm to 60 mm above coil plane 61 which may be defined by one winding of inductive coil 10.

What is claimed is:

1. A method for anisotropic plasma etching of a substrate, the method comprising:
   generating, with a plasma source that is configured to generate a high-frequency electromagnetic alternating field, a plasma having reactive species inside a chamber in a reaction region by the action of the alternating field upon an etching gas inserted into the reaction region and a passivating gas inserted into the reaction region;
   in the reaction region, inserting the etching gas predominantly into a first zone and inserting the passivating gas predominantly into a second zone;
   generating a reactive etching gas species in the first zone by using a plasma that is generated there, and generating reactive passivating gas species in the second zone by using a plasma that is generated there, whereby etching species and passivating species are generated at least largely independently of one another; and
   mixing the etching gas species and the passivating gas species with each other in a mixing region downstream from the reaction region before their action upon the substrate, wherein a quantity of the passivating gas that is used is minimized compared to a quantity of the etching gas.

2. A method for anisotropic plasma etching of a substrate, the method comprising:

generating, with a plasma source that is configured to generate a high-frequency electromagnetic alternating field, a plasma having reactive species inside a chamber in a reaction region by the action of the alternating field upon an etching gas inserted into the reaction region and a passivating gas inserted into the reaction region;

in the reaction region, inserting the etching gas predominantly into a first zone and inserting the passivating gas predominantly into a second zone;

generating a reactive etching gas species in the first zone by the use of a plasma that is generated there, and generating a reactive passivating gas species in the second zone by the use of a plasma that is generated there, whereby etching species and passivating species are generated at least largely independently of one another; and mixing the etching gas species and the passivating gas species, with each other in a mixing region downstream from the reaction region before their action upon the substrate, wherein at least an approximately constant proportion of energy introduced by the plasma source into the plasma is input into the passivating gas at least approximately independently of the passivating gas flow in the reaction region.

* * * * *